(12) United States Patent
Chang et al.

(10) Patent No.: US 9,589,984 B2
(45) Date of Patent: Mar. 7, 2017

(54) DISPLAY APPARATUS, DISPLAY MODULE AND PIXEL STRUCTURE THEREOF

(71) Applicant: E Ink Holdings Inc., Hsinchu (TW)

(72) Inventors: Yung-Sheng Chang, Hsinchu (TW); Chia-Chun Yeh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 28 days.

(21) Appl. No.: 14/729,070

(22) Filed: Jun. 3, 2015

(65) Prior Publication Data

US 2015/0371976 A1 Dec. 24, 2015

Related U.S. Application Data

(60) Provisional application No. 62/014,679, filed on Jun. 19, 2014.

(30) Foreign Application Priority Data

Dec. 16, 2014 (TW) .............................. 103143872 A

(51) Int. Cl.
| | |
|---|---|
| *H05K 1/18* | (2006.01) |
| *H05K 1/11* | (2006.01) |
| *H01L 27/12* | (2006.01) |
| *G09G 3/32* | (2016.01) |
| *G09F 9/302* | (2006.01) |

(52) U.S. Cl.
CPC ......... *H01L 27/1214* (2013.01); *H05K 1/189* (2013.01); *G09F 9/3026* (2013.01); *G09G 3/32* (2013.01); *G09G 3/3216* (2013.01); *G09G 3/3225* (2013.01); *G09G 2300/026* (2013.01); *G09G 2300/0426* (2013.01); *G09G 2300/0465* (2013.01); *G09G 2300/06* (2013.01); *G09G 2300/08* (2013.01); *H01L 2924/0002* (2013.01); *H05K 1/113* (2013.01); *H05K 2201/10106* (2013.01); *H05K 2201/10128* (2013.01)

(58) Field of Classification Search
CPC ............................ H01L 27/32; H01L 27/3206
See application file for complete search history.

(56) References Cited

U.S. PATENT DOCUMENTS

| | | | |
|---|---|---|---|
| 6,774,872 B1 | 8/2004 | Kawada et al. | |
| 7,132,739 B2 | 11/2006 | Akiba et al. | |
| 7,488,104 B2 * | 2/2009 | Hamada ............... | G02B 6/0036 362/561 |
| 8,492,969 B2 | 7/2013 | Lee et al. | |

(Continued)

FOREIGN PATENT DOCUMENTS

| | | |
|---|---|---|
| TW | 201314644 A1 | 4/2013 |
| TW | 201325904 A1 | 7/2013 |

OTHER PUBLICATIONS

Corresponding Taiwanese Office Action that these art references were cited on Feb. 25, 2016.

*Primary Examiner* — John C Ingham
*Assistant Examiner* — Gustavo Ramallo
(74) *Attorney, Agent, or Firm* — CKC & Partners Co., Ltd.

(57) ABSTRACT

A pixel structure located on a periphery of a display module includes a substrate, a flexible circuit board and a plurality of LED chips. The substrate has at least one scribing tolerance reserving zone and a display unit mounting zone. The flexible circuit board is disposed on the display unit mounting zone of the substrate. The LED chips are mounted on the flexible circuit board.

13 Claims, 6 Drawing Sheets

(56) References Cited

U.S. PATENT DOCUMENTS

| | | |
|---|---|---|
| 8,723,768 B2 | 5/2014 | Egi et al. |
| 8,783,930 B2 | 7/2014 | Park et al. |
| 2002/0030647 A1* | 3/2002 | Hack .................... G09G 3/3233 345/82 |
| 2004/0218127 A1* | 11/2004 | Miura .................. G02F 1/1333 349/122 |
| 2005/0247944 A1* | 11/2005 | Haque ................... H01L 33/486 257/79 |
| 2006/0187157 A1* | 8/2006 | Chang ................. G09G 3/3216 345/82 |
| 2006/0216032 A1* | 9/2006 | Millard ............ H01L 23/49838 398/135 |
| 2007/0017694 A1* | 1/2007 | Kubo ................... B41J 2/17526 174/250 |
| 2008/0106874 A1* | 5/2008 | Okuda ................ G02F 1/13452 361/749 |
| 2013/0016505 A1* | 1/2013 | Gianordoli .............. F21S 2/005 362/231 |

* cited by examiner

DISPLAY APPARATUS, DISPLAY MODULE AND PIXEL STRUCTURE THEREOF

RELATED APPLICATIONS

This application claims the priority benefit of provisional application Ser. No. 62/014,679, filed Jun. 19, 2014, the full disclosure of which is incorporated herein by reference. This application also claims the priority benefit of Taiwanese application serial no. 103143872, filed Dec. 16, 2014, the full disclosure of which is incorporated herein by reference.

BACKGROUND

Technical Field

The present invention relates to a display technology, and more particularly, to a display apparatus, a display module and a pixel structure thereof.

Description of Related Art

In pace with the rapid development of the display technology, flat panel displays other than the typical LCD have employed the light emitting diode (LED) as pixel to directly show images. Because the LED itself has advantages such as high brightness, high contrast ratio, low driving voltage, high activation speed, high lighting efficiency, and high stability, the LED display is perspective in the display technology.

The LED display includes a plurality of pixel structures. Each of the pixel structures includes a display unit formed by a plurality of LEDs. In order to improve the optical uniformity, the intervals between the display units are required to be equal. In that a flexible circuit board is disposed on the edge of the LED display to drive the LEDs, the pixel structure on the edge of the LED display has to reserve a certain space for the disposition of the flexible circuit board.

With the higher and higher resolution requirement of the display, both the space of the pixel structure and the intervals between the display units keep reducing. As such, the display unit and the space reserving for the flexible circuit board overlap, which causes the installation of both the display unit and the flexible circuit board impossible. If the display unit and the flexible circuit board are both need to be installed, the location of the display unit has to be changed and also the intervals between the display units that is supposed to be unequal, which affects the optical symmetry and uniformity of the display. As a result, how to balance high resolution requirement and the optical symmetry and uniformity is a dilemma in the development of the LED display.

SUMMARY

One aspect of the present invention balances high resolution requirement and the optical symmetry and uniformity of the LED display apparatus. In particular, one aspect of the present invention reduces the intervals between the display units and keeps the intervals equal.

In accordance with one embodiment of the present invention, a pixel structure located on the edge of a display module includes a substrate, a flexible circuit board and a plurality of LED chips. The substrate has at least one scribing tolerance reserving zone and a display unit mounting zone. The flexible circuit board is disposed on the display unit mounting zone of the substrate. The flexible circuit board is spaced apart from the scribing tolerance reserving zone. The LED chips are mounted on the flexible circuit board. The LED chips respectively emit lights in different wavelengths.

In accordance with another embodiment of the present invention, a display module includes a plurality of the pixel structures. The substrates of the pixel structures are integrally formed.

In accordance with another embodiment of the present invention, a display apparatus includes a plurality of display modules. Each of the display modules includes a plurality of the pixel structures as described above. The substrates of the pixel structures are integrally formed. One of the display modules is joined to another of the display modules.

In the foregoing embodiments, in the pixel structure located on the edge of the display module, the LED chips are mounted on the flexible circuit board, in other words, the LED chips and the flexible circuit board are not respectively mounted on different zones of the substrate, which reduces the area of the pixel structure that the LED chips and the flexible circuit board occupy, thereby reducing the size of the pixel structure, so that the intervals between the display units can be reduced while keeping the intervals equal, thereby improving the resolution of the display apparatus.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
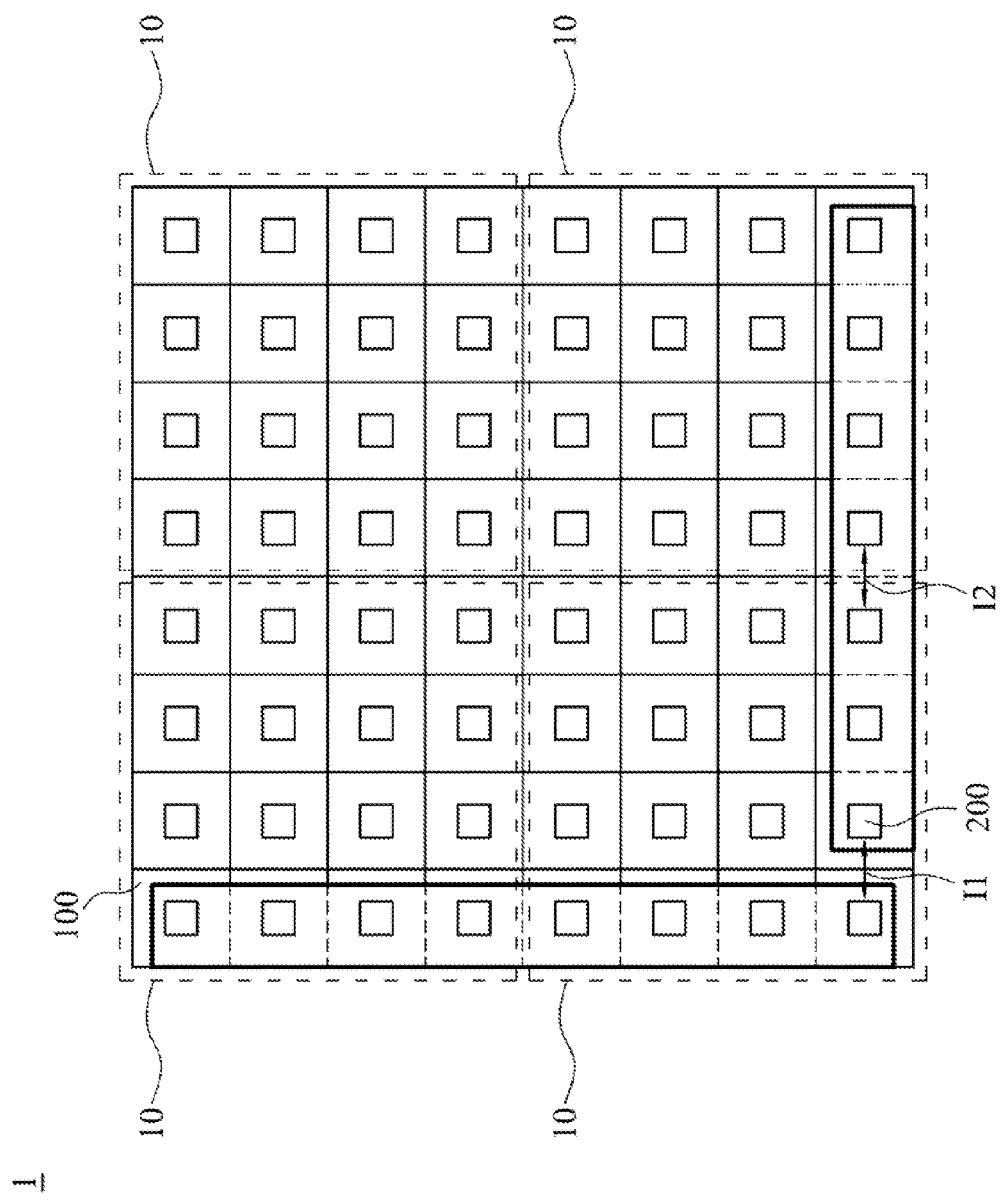
FIG. 1 is a schematic top view of a display apparatus in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
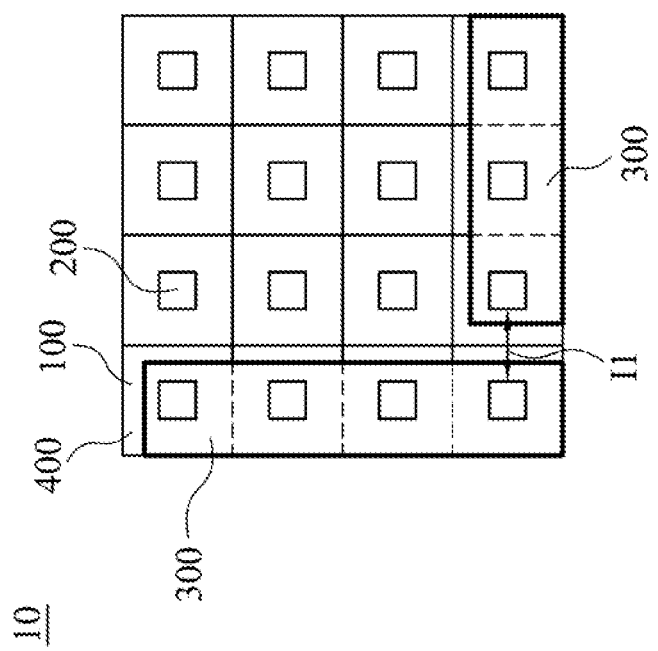
FIG. 2 is a schematic top view of the display module in accordance with one embodiment of the present invention.

FIG. 1 is a schematic top view of a display apparatus 1 in accordance with one embodiment of the present invention. As shown in FIG. 1, in this embodiment, the display apparatus 1 includes a plurality of display modules 10 joined to each other. The number of the display modules 10 can be chosen based on the size requirement of the display apparatus 1. It is noted that the term "joined" in this context means that the edges of two display modules 10 adjacent to each other are in contact to each other and are secured. FIG. 2 is a schematic top view of the display module 10 in accordance with one embodiment of the present invention. As shown in FIG. 2, the display module 10 includes a plurality of pixel structures 100. In some embodiments, these pixel structures 100 are arranged in a 4×4 two-dimensional array. The pixel structure 100 located on the edge of the display module 10 includes a display unit 200 and a flexible circuit board 300. The flexible circuit board 300 drives the display units 200 to emit lights, so as to show images.

In the display module 10, any two display units 200 adjacent to each other define a first interval I1. In order to reduce the first interval I1 for improving the resolution, the reduction of the size of each pixel structure 100 is required. However, if the size of the pixel structure 100 is reduced, the predetermined positions of the display unit 200 and the flexible circuit board 300 may overlap. Therefore, the present invention provides the following solution to solve this issue.

Figure 3:
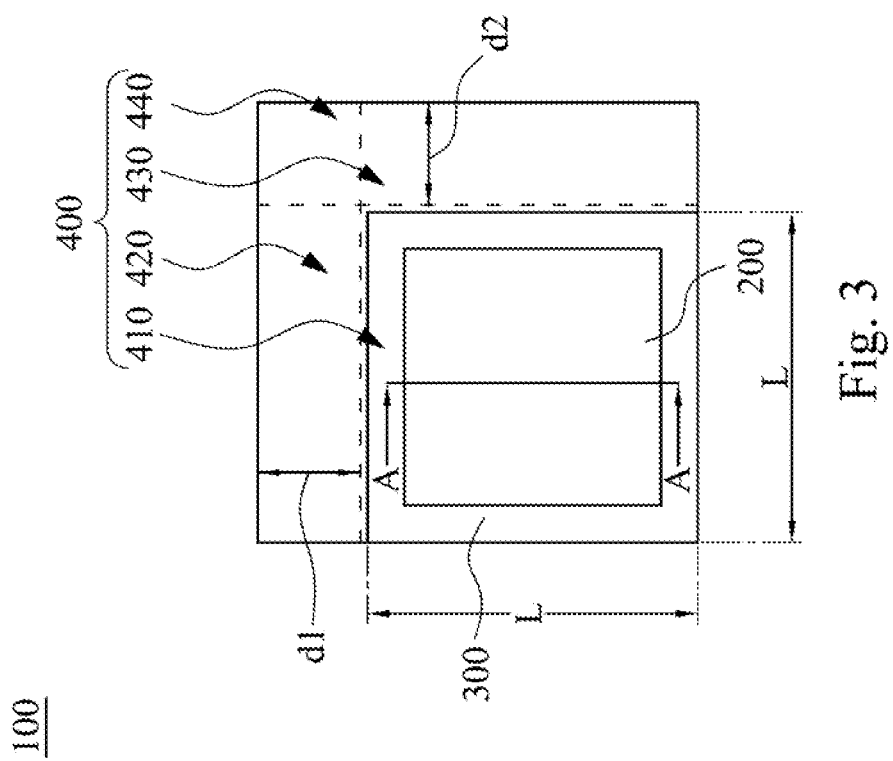
FIG. 3 is a schematic top view of a pixel structure in accordance with one embodiment of the present invention.

In particular, reference can be now made to FIG. 3, which is a schematic top view of a pixel structure 100 in accordance with one embodiment of the present invention. As shown in FIG. 3, the pixel structure 100 includes a display unit 200, a flexible circuit board 300 and a substrate 400. The substrate 400 has a display unit mounting zone 410 and at least one scribing tolerance reserving zone 420. The flexible circuit board 300 is disposed on the display unit mounting zone 410 of the substrate 400. The flexible circuit board 300 is spaced apart from the scribing tolerance reserving zone 420. The display unit 200 is mounted on the flexible circuit board 300.

In the foregoing embodiment, the display unit 200 is disposed on the flexible circuit board 300. In other words, the display unit 200 and the flexible circuit board 300 are not respectively mounted on different zones of the substrate 400, which reduces the area of substrate 400 that the display unit 200 and the flexible circuit board 300 occupy, thereby reducing the size of the substrate 400, so that the first intervals I1 between the display units 200 can be reduced, thereby improving the resolution.

In some embodiments, as shown in FIG. 2, the first intervals I1 defined by any two of the display units 200 adjacent to each other are substantially equal, so as to improve the optical uniformity of the display module 10. In some embodiments, as shown in FIG. 1, any two of the display units 200 adjacent to each other in different display modules 10 define a second interval I2. The first interval I1 and the second interval I2 are substantially equal, so as to improve the optical uniformity of the display apparatus 1. In other words, when plural display modules 10 are joined to form the display apparatus 1, the display units 200 are arranged uniformly around the boundary between the display modules 10.

In some embodiments, as shown in FIG. 2, the substrates 400 of different pixel structures 100 in one display module 10 are integrally formed so as to facilitate the fabrication of the display module 10.

In some embodiments, as shown in FIG. 3, the display unit mounting zone 410 has a length L, which may range, but is not limited to range, from 800 μm to 1000 μm. By the length L within this range, the display unit 200 and the flexible circuit board 300 can only occupy one square zone of the substrate 400, and the length L of the square zone only ranges from 800 μm to 1000 μm, which facilitates to reduce the size of the substrate 400.

Moreover, because the substrate 400 has the scribing tolerance reserving zone 420, and the flexible circuit board 300 and the display unit 200 are both located out of the scribing tolerance reserving zone 420, the scribing tolerance reserving zone 420 provides a buffer zone to facilitate the manufacturer to cut the pixel structure 100, which prevents the manufacturer from cutting the display unit 200 or the flexible circuit board 300 during the period to cut the pixel structure 100. For example, the scribing tolerance reserving zone 420 has a width d1, which may range, but is not limited to range, from 200 μm to 300 μm. The width d1 may be adjusted based on the dimensional tolerance of the cutting machine.

In some embodiments, as shown in FIG. 3, the substrate 400 further includes a scribing tolerance reserving zone 430 and a scribing tolerance reserving overlapping zone 440. The scribing tolerance reserving zone 430 is located on the right side of the display unit mounting zone 410. The scribing tolerance reserving zone 420 is located on the top side of the display unit mounting zone 410. The scribing tolerance reserving overlapping zone 440 is connected between the scribing tolerance reserving zones 420 and 430. The scribing tolerance reserving zones 420, 430 and the scribing tolerance reserving overlapping zone 440 form an L-shaped zone. The L-shaped zone adjoins to the adjacent edges of the display unit mounting zone 410, such as the top edge and the right edge of the display unit mounting zone 410 in the figure. The display unit 200 and the flexible circuit board 300 are both located out of the scribing tolerance reserving zone 430 and the scribing tolerance reserving overlapping zone 440, so they are spaced apart from the scribing tolerance reserving zone 430 and the scribing tolerance reserving overlapping zone 440. By this configuration, the substrate 400 provides an L-shaped buffer zone, so as to prevent the manufacturer from cutting the display unit 200 or the flexible circuit board 300 during the period to cut the pixel structure 100. In some embodiments, the scribing tolerance reserving zone 430 has a width d2, which may range, but is not limited to range, from 200 μm to 300 μm. The width d2 may be adjusted based on the dimensional tolerance of the cutting machine.

Figure 4:
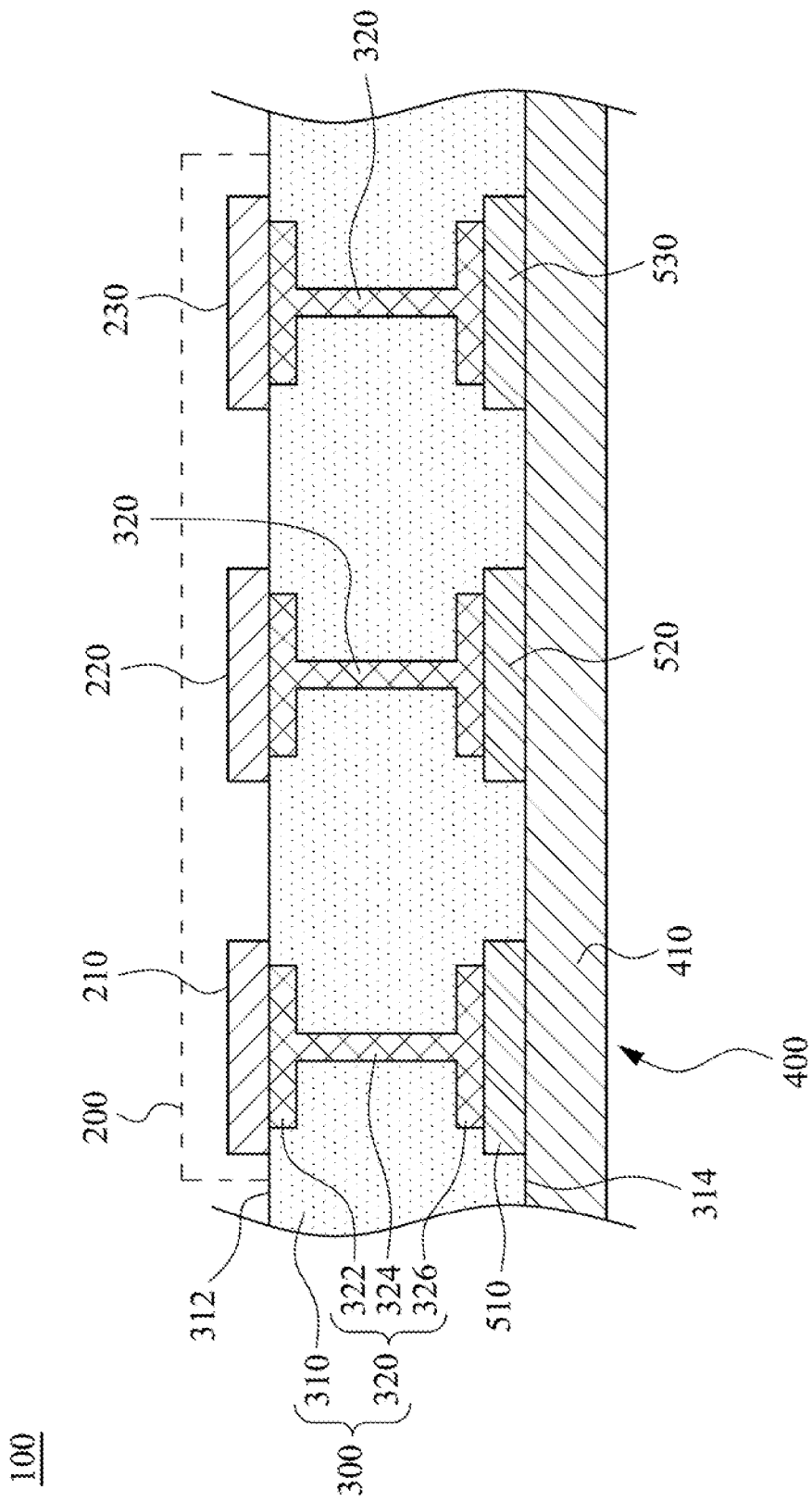
FIG. 4 is a schematic cross-sectional view of the pixel structure taken along A-A' line in FIG. 3.

FIG. 4 is a schematic cross-sectional view of the pixel structure 100 taken along A-A' line in FIG. 3. As shown in FIG. 4, in some embodiments, the display unit 200 includes a plurality of LED chips 210, 220 and 230. In other words, the LED chips 210, 220 and 230 form the display unit 200. The LED chips 210, 220 and 230 respectively emit lights in different wavelengths, so that the lights can be mixed to form a light in a desired wavelengths. For example, the LED chip 210 may be a red LED chip; the LED chip 220 may be a green LED chip; and the LED chip 230 may be a blue LED chip. It is understood that the colors of the lights emitted by the LED chips are just explanatory, not used to limit the present invention. In some embodiments, the LED chips 210, 220 or 230 may be a die, or may be a packaged chip.

In some embodiments, as shown in FIG. 4, the LED chips 210, 220 and/or 230 may be driven in an active matrix driving manner. For example, the pixel structure 100 may include thin film transistors 510, 520 and 530. The thin film transistor 510 is electrically connected to the LED chip 210; the thin film transistor 520 is electrically connected to the LED chip 220; and the thin film transistor 530 is connected to the LED chip 230. By such the configuration, the LED chips 210, 220 and 230 can be respectively driven by the thin film transistors 510, 520 and 530, thereby implementing the active matrix driving way.

In particular, as shown in FIG. 4, the thin film transistors 510, 520 and 530 are disposed on the display unit mounting zone 410 of the substrate 400. For example, the substrate can be a glass substrate, which allows the thin film transistors 510, 520 and 530 disposed thereon. The flexible circuit board 300 covers the thin film transistors 510, 520 and 530 and is electrically connected to the thin film transistors 510, 520 and 530 and the LED chips 210, 220 and 230. For example, the flexible circuit board 300 includes an insulation body 310 and a driving wire 320. The driving wire 320 extends through the insulation body 310. One driving wire 320 is connected between the thin film transistor 510 and the LED chip 210. Another driving wire 320 is connected between the thin film transistor 520 and the LED chip 220. Another driving wire 320 is connected between the thin film transistor 530 and the LED chip 230.

In particular, the insulation body 310 of the flexible circuit board 300 includes a first surface 312 and a second surface 314 opposite to each other. The driving wire 320 includes a first connection pad 322, a connection wire 324 and a second connection pad 326. The first connection pad 322 is located on the first surface 312. The second connection pad 326 is disposed on the second surface 314. The LED chip 210 is disposed on the first connection pad 322, and the second connection pad 326 is electrically connected to the thin film transistor 510. As a result, the LED chip 210 and the thin film transistor 510 can be electrically connected via the driving wire 320 that extends through the insulation body 310. The electrical connection between the LED chip 220 and the thin film transistor 520, and the electrical connection between the LED chip 230 and the thin film transistor 530 are similar to the electrical connection between the LED chip 210 and the thin film transistor 510, and therefore, they not described repeatedly.

Figure 5:
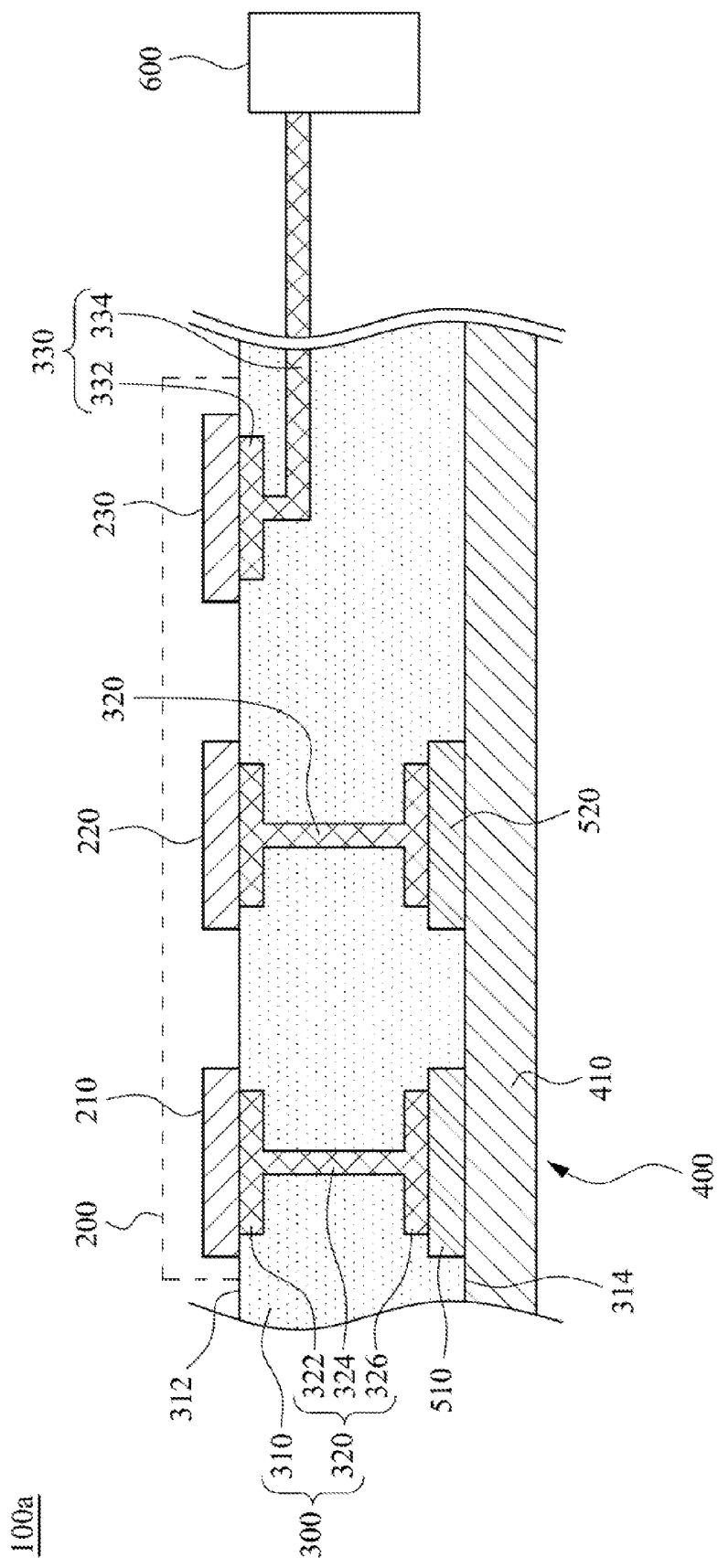
FIG. 5 is a schematic cross-sectional view of a pixel structure in accordance with another embodiment of the present invention.

FIG. 5 is a schematic cross-sectional view of a pixel structure 100a in accordance with another embodiment of the present invention. As shown in FIG. 5, the main difference between this embodiment and which is shown in FIG. 4 is that: the pixel structure 100a further includes a passive matrix driving module 600 to drive at least one LED chip in a passive matrix manner. In particular, the flexible circuit board 300 includes a driving wire 330. The driving wire 330 includes a connection pad 332 and a connection wire 334. The connection pad 332 is located on the first surface 312 of the insulation body 310 of the flexible circuit board 300. The connection wire 334 is partially disposed in the insulation body 310 and is connected between the connection pad 332 and the passive matrix driving module 600. The LED chip 230 is disposed on the connection pad 332 and is connected to the passive matrix driving module 600 via the connection wire 334 of the driving wire 330, so as to implement the passive matrix driving way. It is understood that although in this embodiment, the LED chip 230 is driven in the passive matrix manner, in other embodiments, the LED chip 210 and/or the LED chip 220 can be driven in the passive matrix manner.

Figure 6:
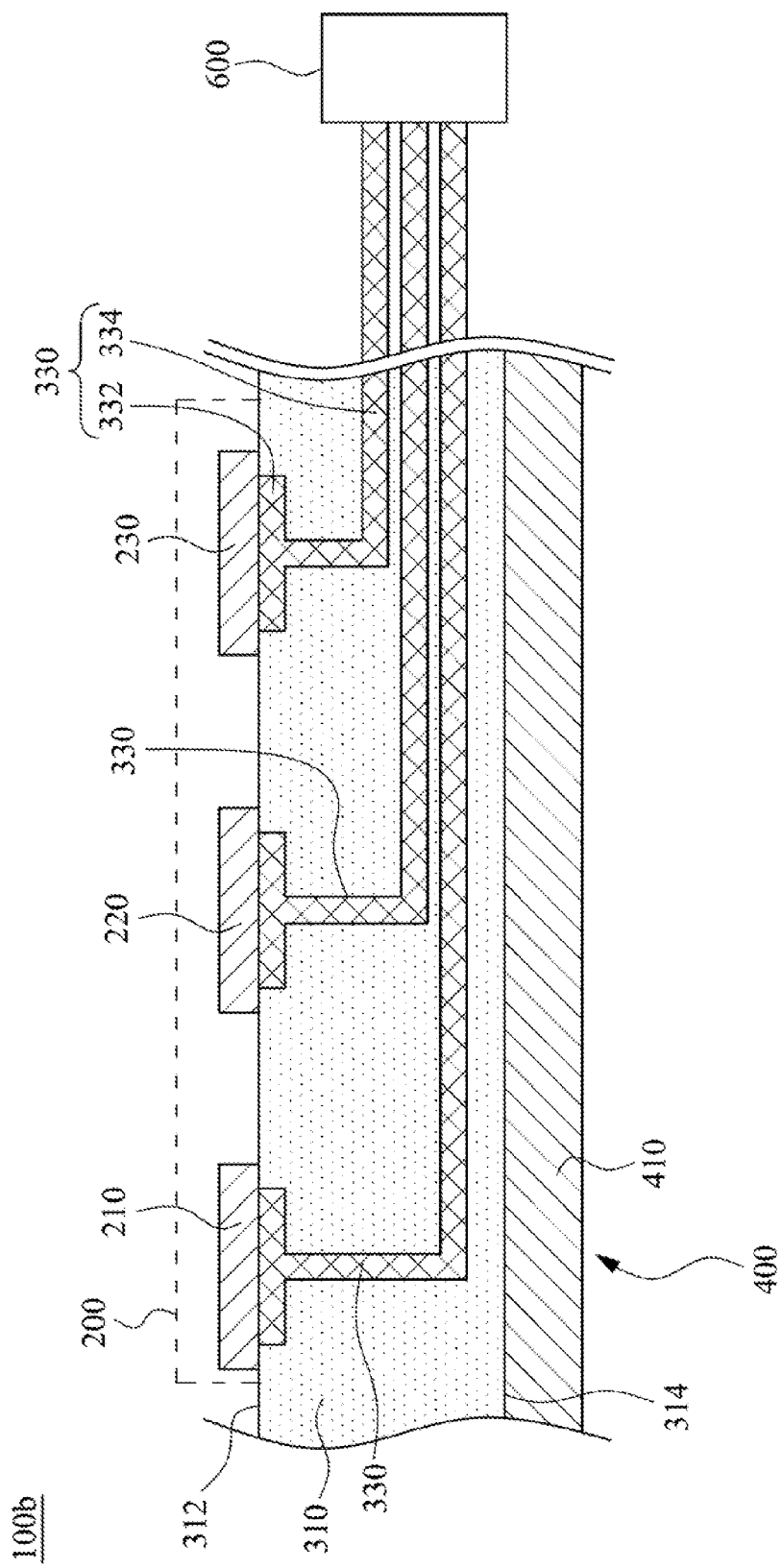
FIG. 6 is a schematic cross-sectional view of a pixel structure in accordance with another embodiment of the present invention.

For example, reference can be now made to FIG. 6 which is a schematic cross-sectional view of a pixel structure 100b in accordance with another embodiment of the present invention. As shown in FIG. 6, the LED chips 210, 220 and 230 can be connected to the passive matrix driving module 600 via different driving wires 330. In other words, LED chips 210, 220 and 230 can all be driven in the passive matrix manner.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A pixel structure of a display, comprising:
   a substrate having a scribing tolerance reserving zone and a display unit mounting zone;
   a flexible circuit board disposed on the display unit mounting zone of the substrate, the flexible circuit board being spaced apart from the scribing tolerance reserving zone, the flexible circuit board comprising at least one driving wire partially buried therein, the partially buried driving wire comprising a first connection pad;
   a plurality of LED chips mounted on the flexible circuit board, the LED chips respectively emitting lights in different wavelengths,
   wherein at least one of the LED chips is mounted on the first connection pad of the partially buried driving wire in the flexible circuit board; and
   a thin film transistor covered by the flexible circuit board and electrically connected to the at least one of the LED chips via the partially buried driving wire in the flexible circuit board.

2. The pixel structure of claim 1, wherein the flexible circuit board comprises a first surface and a second surface opposite to each other, and the first connection pad is located on the first surface, and the driving wire further comprises a second connection pad disposed on the second surface, wherein the second connection pad is electrically connected to the thin film transistor.

3. The pixel structure of claim 1, further comprising:
   a passive matrix driving module, wherein the first connection pad is located on one surface of the flexible circuit board, and the at least one of the LED chips is connected to the passive matrix driving module via the driving wire.

4. The pixel structure of claim 1, wherein the scribing tolerance reserving zone has a width ranges from 200 μm to 300 μm.

5. The pixel structure of claim 1, wherein the display unit mounting zone has a length ranges from 800 μm to 1000 μm.

6. A display module, comprising:
   a plurality of pixel structures, each of the pixel structure comprising:
   a substrate having a scribing tolerance reserving zone and a display unit mounting zone;
   a flexible circuit board disposed on the display unit mounting zone of the substrate, the flexible circuit board being spaced apart from the scribing tolerance reserving zone, the flexible circuit board comprising at least one driving wire partially buried therein, the partially buried driving wire comprising a first connection pad;
   a plurality of LED chips mounted on the flexible circuit board, the LED chips respectively emitting lights in different wavelengths, wherein at least one of the LED chips is mounted on the first connection pad of the partially buried driving wire in the flexible circuit board; and
   a thin film transistor covered by the flexible circuit board and electrically connected to the at least one of the LED chips via the partially buried driving wire in the flexible circuit board,
   wherein the substrates of the pixel structures are integrally formed.

7. The display module of claim 6, wherein the LED chips of each of the pixel structures form a display unit, wherein any two of the display units adjacent to each other define an interval, and the intervals are substantially equal.

8. The display module of claim 6, wherein, in each of the pixel structures, the flexible circuit board comprises a first surface and a second surface opposite to each other, and the first connection pad is located on the first surface, and the driving wire further comprises a second connection pad disposed on the second surface, wherein the at least one of the LED chips is disposed on the first connection pad, and the second connection pad is electrically connected to the thin film transistor.

9. The display module of claim 6, further comprising:
a passive matrix driving module, wherein the first connection pad is located on one surface of the flexible circuit board, and the at least one of the LED chips is connected to the passive matrix driving module via the driving wire.

10. The display module of claim 6, wherein each of the scribing tolerance reserving zones has a width ranges from 200 μm to 300 μm.

11. The display module of claim 6, wherein each of the display unit mounting zones has a length ranges from 800 μm to 1000 μm.

12. A display apparatus, comprising:
a plurality of display modules, each of the display modules comprising a plurality of pixel structures, each of the pixel structures comprising:
a substrate having a scribing tolerance reserving zone and a display unit mounting zone;
a flexible circuit board disposed on the display unit mounting zone of the substrate, the flexible circuit board being spaced apart from the scribing tolerance reserving zone, the flexible circuit board comprising at least one driving wire partially buried therein, the partially buried driving wire comprising a first connection pad;
a plurality of LED chips mounted on the flexible circuit board, the LED chips respectively emitting lights in different wavelengths, wherein at least one of the LED chips is mounted on the first connection pad of the partially buried driving wire in the flexible circuit board; and
a thin film transistor covered by the flexible circuit board and electrically connected to the at least one of the LED chips via the partially buried driving wire in the flexible circuit board,
wherein the substrates of the pixel structures are integrally formed, wherein one of the display modules is joined to another of the display modules.

13. The display apparatus of claim 12, wherein the LED chips of each of the pixel structures form a display unit, wherein any two of the display units adjacent to each other in each of the display modules define a first interval, wherein any two of the display units adjacent to each other in different display modules define a second interval, wherein the first interval and the second interval are substantially equal.

* * * * *